United States Patent [19]
Klose

[11] Patent Number: 6,043,543
[45] Date of Patent: Mar. 28, 2000

[54] READ-ONLY MEMORY CELL CONFIGURATION WITH TRENCH MOS TRANSISTOR AND WIDENED DRAIN REGION

[75] Inventor: Helmut Klose, Poughkeepsie, N.Y.

[73] Assignee: Siemens Aktiengesellschaft, Munich, Germany

[21] Appl. No.: 09/086,011

[22] Filed: May 28, 1998

Related U.S. Application Data

[63] Continuation of application No. PCT/DE96/02287, Nov. 28, 1996.

[30] Foreign Application Priority Data

Nov. 28, 1995 [DE] Germany ................ 195 44 327

[51] Int. Cl.[7] ............................................. H01L 29/76
[52] U.S. Cl. .......................... 257/390; 257/330; 257/332; 257/391
[58] Field of Search ................................ 257/330, 390, 257/391, 332

[56] References Cited

U.S. PATENT DOCUMENTS

| | | | |
|---|---|---|---|
| 4,198,693 | 4/1980 | Kuo | 365/104 |
| 4,263,663 | 4/1981 | Powell | 365/182 |
| 4,296,429 | 10/1981 | Schroeder | 257/330 |
| 4,503,449 | 3/1985 | David et al. | 257/330 |
| 4,859,615 | 8/1989 | Tsukamoto et al. | 438/247 |
| 4,929,987 | 5/1990 | Einthoven | 257/330 |
| 4,954,854 | 9/1990 | Dhong et al. | 257/332 |
| 5,057,887 | 10/1991 | Yashiro et al. | 257/305 |
| 5,300,804 | 4/1994 | Arai | 365/104 |

FOREIGN PATENT DOCUMENTS

| | | |
|---|---|---|
| 44 34 725 C1 | 5/1996 | Germany . |
| 44 37 581 C2 | 5/1996 | Germany . |

OTHER PUBLICATIONS

Patent Abstracts of Japan No. 630 24 660 (Hiroyuki), dated Feb. 2, 1988.
Patent Abstracts of Japan No. 601 24 970 (Akio et al.), dated Jul. 4, 1985.

*Primary Examiner*—Mahshid Saadat
*Assistant Examiner*—George C. Eckert, II
*Attorney, Agent, or Firm*—Herbert L. Lerner; Laurence A. Greenberg; Werner H. Stemer

[57] ABSTRACT

A read-only memory cell configuration and a method for its production include a substrate formed of semiconductor material having memory cells disposed in a cell field in a region of a main area. Each memory cell has at least one MOS transistor with a source region, a drain region, a channel region, a gate dielectric and a gate electrode. The drain region is connected to a bit line and the gate electrode is connected to a word line. The MOS transistor is formed by a trench starting at the main area and reaching as far as the source region. Side walls of the trench are disposed at an angle of approximately 45° to approximately 80° relative to the main area and are doped with a doping material of a predetermined conductivity for defining the programming of the MOS transistor.

11 Claims, 3 Drawing Sheets

READ-ONLY MEMORY CELL CONFIGURATION WITH TRENCH MOS TRANSISTOR AND WIDENED DRAIN REGION

CROSS-REFERENCE TO RELATED APPLICATION

This application is a continuation of International Application No. PCT/DE96/02287, filed on Nov. 28, 1996, which designated the United States.

BACKGROUND OF THE INVENTION

Field of the Invention

The invention relates to a read-only memory cell configuration and a method for the production of a read-only memory cell configuration including a substrate formed of semiconductor material and having memory cells disposed in a cell field in a region of a main area, each memory cell having at least one MOS transistor with a source region, a drain region, a channel region, a gate dielectric and a gate electrode, the drain region connected to a bit line, the gate electrode connected to a word line, and the MOS transistor formed by a trench starting at the main area of the substrate and reaching as far as the source region.

Such a read-only memory cell configuration and such a method for its production are described, for example, in German Published, Non-Prosecuted Patent Applications DE 44 34 725 A1 and DE 44 37 581 A1, having the same assignee as the instant application and to which reference is fully made. Read-only memories are used to store data in many electronic systems. Such memories, in which the data are written-in permanently in digital form, are realized as silicon circuits that have an integrated construction based on a semiconductor material, in particular silicon, and in which MOS transistors are preferably used as memory cells. During read-out, the individual memory cells are selected through the gate electrode of the MOS transistors, which is connected to a word line. The input of each MOS transistor is connected to a reference line and the output is connected to a bit line. During the reading operation, an assessment is made as to whether or not a current is flowing through the transistor. Logic values 0 and 1 are assigned correspondingly to the stored data. The storage of 0 and 1 in such read-only memories is effected in technical terms in such a way that no MOS transistor is produced or no conductive connection to the bit line is realized in memory cells in which the logic value assigned to a state "no current flow through the transistor" is stored. As an alternative, MOS transistors which have different threshold voltages due to different implantations in the channel region can be correspondingly realized for the two logic values. Such a silicon memory has an essentially planar structure with a minimum area requirement for each memory cell, which is about 4 to 8 $F^2$, where F denotes the smallest structure size that can be produced with the respective technology. In the case of one-$\mu$m technology, planar read-only silicon memories are thus limited to storage densities of about 0.14 bit/$\mu m^2$.

SUMMARY OF THE INVENTION

It is accordingly an object of the invention to provide a read-only memory cell configuration and a method for its production on a semiconductor basis, which overcome the hereinafore-mentioned disadvantages of the heretofore-known devices and methods of this general type and which afford simpler and more cost-effective manufacture in conjunction with a high packing density of the memory cells and a high yield.

With the foregoing and other objects in view there is provided, in accordance with the invention, a read-only memory cell configuration, comprising a substrate formed of semiconductor material and having a main area; a cell field having memory cells in the region of the main area; a bit line and a word line; each of the memory cells in each case having at least one MOS transistor with a source region, a drain region, a channel region, a gate dielectric and a gate electrode, the drain region connected to the bit line and the gate electrode connected to the word line; and the at least one MOS transistor formed by a trench starting at the main area and reaching as far as the source region, the trench defining side walls disposed at an angle of between approximately 45° and approximately 80° relative to the main area and doped with a doping material of a predetermined conductivity for defining a programming of the at least one MOS transistor.

In a particularly preferred embodiment of the invention, the angle of the side walls of the trench of the MOS transistor with respect to the main area of the substrate is approximately 70° to approximately 80° and preferably approximately 75°. As a result of the inventive beveling of the side walls of the trench, programming of the trench transistors can be effected more simply in terms of manufacturing and engineering, and therefore more cost-effectively, preferably through the use of implantation, wherein it is necessary to merely accept a slightly larger memory cell area and thus an only slightly lower packing density of the memory cells in comparison with the trench transistors having a vertical construction which are known per se. In contrast, in the case of MOS transistors having a vertical construction in the trenches, it is difficult, during programming through the use of implantation, for the implantation beam, which is guided at right angles with respect to the substrate surface, to reach the side walls effectively. For this reason, in general only the bottom of the trench is properly implanted in the case of transistors having a vertical construction, with the implantation additionally being subject to shading problems due to the photo-resist mask which is used during implantation and normally has a thickness of approximately 1 to 2 $\mu$m. According to the invention, it is now possible to also implant the beveled side slopes of the trench transistors, with the result that the threshold voltage of the trench transistors can be set in a significantly simpler and more accurate manner.

In accordance with another feature of the invention, two or more MOS transistors are formed in each trench. It is possible to set the two or more side slopes of a trench separately from one another by implantation with the use of masking which is executed in two or more successive stages.

In accordance with a further feature of the invention, two MOS transistors are formed in one trench, and the transistors are programmed differently by different doping of the two side walls of the trench.

In accordance with an added feature of the invention, the two MOS transistors formed in a trench each have a common source region and a common gate region.

In accordance with an additional feature of the invention, due to the configuration according to the invention and due to the method according to the invention, it is possible to assign to a transistor not only a binary setting with the two states 0 or 1 but also, by refining the implantation, a predetermined logic state from status logic having multi-value logic states, in particular four-value status logic.

In accordance with yet another feature of the invention, the invention is suitable both for the production of one-time electrically programmable read-only memories, in which the gate dielectric has, in particular, an ONO forming material (so-called OTP memories—One-Time Programmable Memory) or, as an alternative, for the manufacture of mask-programmable read-only memories (so-called mask-programmable ROM), in which the gate dielectric has, in particular, a gate oxide.

In order to produce the read-only memory cell configuration, a first doped region and a second doped region are produced in a silicon substrate which is doped by a first conductivity type, for example the $n^+$ type. The first doped region is doped by a second conductivity type opposite to the first, for example the p type, and preferably extends over the entire cell field. This may be formed both as a correspondingly extended trough and as a continuous layer over the entire substrate. Each trench of the memory cell field preferably extends, starting at the main area, down through the entire depth of the first doped region and reaches somewhat into the region of the silicon substrate of the first conductivity type. In this way, the region of the substrate of the first conductivity type can be used as a common source region for all of the trench transistors of a memory cell field.

The second doped region is doped by the first conductivity type, for example the $n^+$ type, and adjoins the main area of the substrate. The second doped region serves as a drain connection of the trench transistors and is electrically connected to the bit lines of the memory cells.

Furthermore, a plurality of insulation regions are produced which run essentially parallel, have a strip-like cross-section directed parallel to the main area and run over the entire cell field. These insulation regions reach from the main area down into the first doped region and are used, inter alia, for the electrical insulation of the individual memory cells.

The memory cells are preferably disposed in rows and columns. One insulation region in each case is disposed between each two columns. Word lines to which the gate electrodes of the memory transistors are connected run transversely with respect to the insulation regions.

The insulation regions can advantageously be produced with such spacings and with such widths that the distance between adjacent insulation regions is essentially equal to the width of the insulation regions. Furthermore, the trenches for the memory transistors can have linear dimensions, measured in cross-section parallel to the main area, which are essentially equal to the width of the insulation regions. That means that the trenches for the memory transistors which are produced can, for example, resemble a truncated pyramid with a square base area having a side length corresponding to the width of the insulation regions, or can resemble a truncated cone with a base area diameter corresponding to the width of the insulation regions. In this case the center point of the cross-section of the base area of the memory cell trenches can be disposed offset with respect to the center of the insulation regions.

If, in this embodiment, the width of the insulation regions is produced in such a way that it is equal to the smallest structure size F which can be produced with the technology used, then the area required by a memory cell is $2 F^2$. This embodiment of the invention exploits the fact that the alignment accuracy is always better than the smallest structure size F that can be produced. In the case of one-$\mu$m technology, it is thus possible to produce a memory cell having an area of 4 $\mu m^2$ as a square, with the result that storage densities of about 0.25 bit/$\mu m^2$ can be achieved.

In accordance with yet a further feature of the invention, a local interconnection is assigned to the second doped region or the drain region of the MOS transistor, and the local interconnection electrically connects the drain region and is disposed, at least in regions, over a gate insulation layer, which electrically insulates the gate electrode, and an insulation layer, which is disposed adjacent the MOS transistor. This measure enables the packing density of the memory cells to be increased further, without significantly increasing the outlay and therefore the costs for the manufacture of the read-only memory cell configuration. The local interconnection enables a contact point for the drain regions of the transistors to be produced which is to a certain extent buried, as a result of which any overlap of the contact hole (to be produced later) for the electrical connection of the bit lines relative to the gate and insulation edges of the memory cells can be reduced to zero and the packing density can thus be increased. In this case, the local interconnections are disposed as a widening of the contact connections of the drain regions and as bottom regions of the contact holes which are to be applied later and have a certain width dictated by production.

In accordance with yet an added feature of the invention, the electrically conductive local interconnection is formed of a material which has polysilicon, polycide or silicide and which is preferably deposited by using the CVD (Chemical Vapor Deposition) method. In contrast with this measure according to the invention, in the case of the previous read-only memory cell configurations, sufficient widths of the so-called LOCOS layer had to be specified due to production-dictated tolerances on the order of magnitude of approximately 0.3 F, in order to ensure that the contact hole, which likewise had a considerable width, could be positioned reliably at the correct point depending on the process.

It is within the scope of the invention to simultaneously form MOS transistors for driving the memory cell configuration at the periphery on the substrate during the production of the cell field of the memory cell configuration. The gate oxide and the gate electrodes of the MOS transistors in the periphery in this case can be formed with the same process steps as the gate oxide and the gate electrodes in the cell field.

With the objects of the invention in view there is also provided a method for the production of a read-only memory cell configuration, which comprises providing a substrate formed of semiconductor material and having a main area; providing a cell field having memory cells in the region of the main area, each memory cell in each case having at least one MOS transistor with a source region, a drain region, a channel region, a gate dielectric and a gate electrode; connecting the drain region to a bit line and connecting the gate electrode to a word line; and forming the at least one MOS transistor by a trench starting at the main area, reaching as far as the source region and having side walls disposed at an angle of between approximately 45° and approximately 80° relative to the main area and doped with a doping material of a predetermined conductivity for defining a programming of the at least one MOS transistor.

Other features which are considered as characteristic for the invention are set forth in the appended claims.

Although the invention is illustrated and described herein as embodied in a read-only memory cell configuration and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
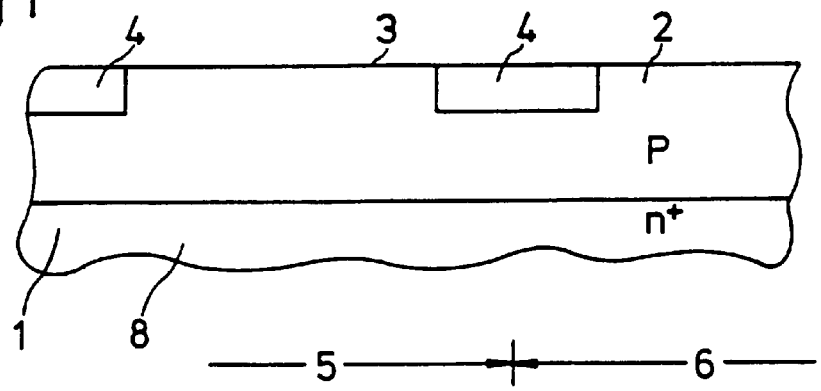
FIG. 1 is a fragmentary, diagrammatic, sectional view of a read only memory cell configuration, to be formed on a p/n$^+$ silicon wafer, according to a first exemplary embodiment of the invention following definition of insulation regions through the use of so-called box insulation.

Referring now to the figures of the drawings in detail and first, particularly, to FIG. 1 thereof, there is seen a first doped region 2 which is produced on a substrate 1 that is made, for example, of n$^+$-doped monocrystalline silicon with a dopant concentration of $1 \times 10^{19}$ cm$^{-3}$. The first doped region 2 is, for example, p-doped with a dopant concentration of, for example, $5 \times 10^{16}$ cm$^{-3}$. The first, p-doped region 2 is produced, for example, by whole-area or masked implantation with boron or by growing on a layer which is p-doped in situ through the use of CVD epitaxy. The first doped region 2 has a main area 3 and has a thickness of, for example, 0.5 μm to 1 μm, measured perpendicularly with respect to the main area 3. Insulation regions 4 for definition of a memory cell field 5 and for insulation from circuits disposed in a peripheral region 6 are formed by using a mask which is applied to the main area 3, but is not illustrated in detail for the sake of clarity. The insulation regions 4 run in a strip-like manner over the main area 3 and they start at the main area 3 and reach down partly into the first doped region 2. The insulation regions 4 are formed, for example, of SiO$_2$ islands.

Figure 2:
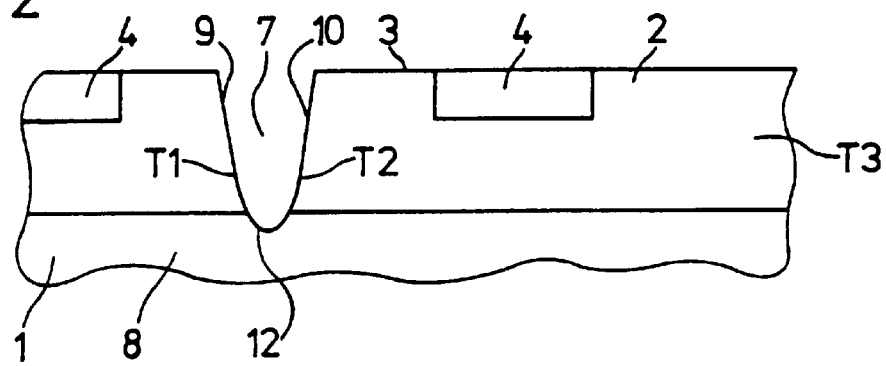
FIG. 2 is a fragmentary, sectional view of the wafer following an etching of trenches, in which side walls of the trenches are made at an angle of approximately 75° with respect to a main area of the substrate.

This is followed by the production of trenches 7, preferably through the use of an anisotropic dry etching process, using a trench mask which is applied to the main area 3, but is not illustrated in detail for the sake of clarity. The trenches 7 run in a strip-like manner over the main area 3 in that part of the substrate 1 in which the cell field 5 is formed. The trenches 7 have a depth of, for example, approximately 0.5 μm to approximately 1 μm. The trenches 7 reach down into an n$^+$-doped region 8 of the substrate 1. Parallel to the main area 3, the trenches 7 have a width with a minimum structure size F, for example 0.6 μm, and a length of, for example, 100 μm. In the region of a cell field 5, for example, 16,000 trenches are disposed in parallel next to one another. A distance between adjacent trenches 7 once again has a minimum structure size, for example 0.6 μm. As is seen in FIG. 2, the trenches 7 are etched in such a way that the side walls 9 and 10 are made at an angle of approximately 75° rather than perpendicularly. This etching can be realized either by an appropriate setting of parameters of the respective dry etching or by anisotropic chemical etching such as, for example, through the use of KOH.

A threshold voltage of trench transistors T1 and T2, and of planar transistors T3 situated outside the cell field 5 in the peripheral region 6, is subsequently defined through the use of an implantation step. For this purpose, a suitable implantation mask is applied in each case to the main area 3 and structured and the transistors are set by a suitable selection of an implantation dose. In this case, it is also possible to realize multiple implantation in one transistor, thereby enabling the production of a multi-value memory cell, for example a four-value memory cell. The implantation can be carried out, for example, with boron, in which it is possible for the implantation energy to be approximately 25 keV, for example, and the dose to be $1 \times 10^{12}$ cm$^{-3}$, for example.

Figure 3:
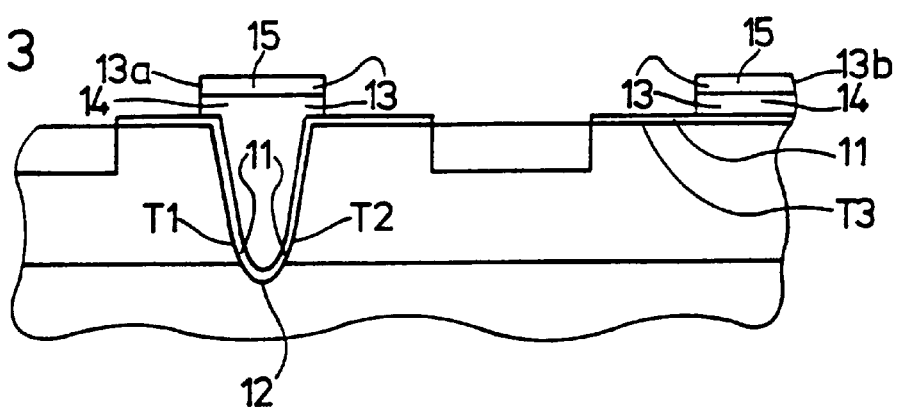
FIG. 3 is a fragmentary, sectional view of the wafer following definition of a threshold voltage of trench transistors and of planar peripheral transistors, gate oxide or ONO forming, deposition of a gate polysilicon and covering with an SiO$_2$ layer, as well as structuring through the use of anisotropic etching.

This is followed by gate oxide deposition in the case of a mask-programmed read-only memory, or by ONO forming as in the case of a one-time electrically programmable read-only memory. When producing a gate oxide, thermal oxidation, for example, is carried out at 750° C., for example, once the implantation mask has been removed. In the process a gate oxide 11 is produced on exposed silicon surfaces, as is seen in FIG. 3. The gate oxide 11 is produced in this case both on exposed silicon surfaces which form the side walls 9, 10 and a bottom 12 of the trenches 7, as well as in the peripheral region 6 on an exposed surface of the first doped region 2. Due to the different doping, the gate oxide 11 in the trenches 7 grows on with a smaller thickness than on the surface of the substrate 1. A conductive layer 13 which is made, for example, of doped polysilicon, is subsequently deposited over the whole area.

The conductive layer 13 is deposited with essentially conformal edge covering. The thickness of the conductive layer 13 is set in such a way that the trenches 7 are completely filled. The conductive layer 13 is deposited, for example, by using a CVD method with SiH$_4$, wherein phosphorus is added to a process gas as a dopant. The conductive layer 13 is deposited with a thickness of 400 nm, for example. A non-illustrated photoresist mask is subsequently produced. The conductive layer 13 is structured in an anisotropic etching process, for example by using HBr, Cl$_2$ and by using the photoresist mask as an etching mask. Word lines 13a are formed in this case from the conductive layer 13 in the region of the cell field 5. At the same time, gate electrodes 13b for MOS transistors are produced in the peripheral region 6. The word lines 13a run transversely with respect to the insulation regions 4.

As an alternative, as is illustrated in FIG. 3, a gate polysilicon layer 14, which is either doped directly or is doped through the use of implantation or POCL coating, can be deposited and covered with a further SiO$_2$ layer 15, which is deposited, for example, by using a TEOS method with essentially conformal edge covering. This configuration can be structured according to FIG. 3 through the use of an anisotropic etchant.

Figure 4:
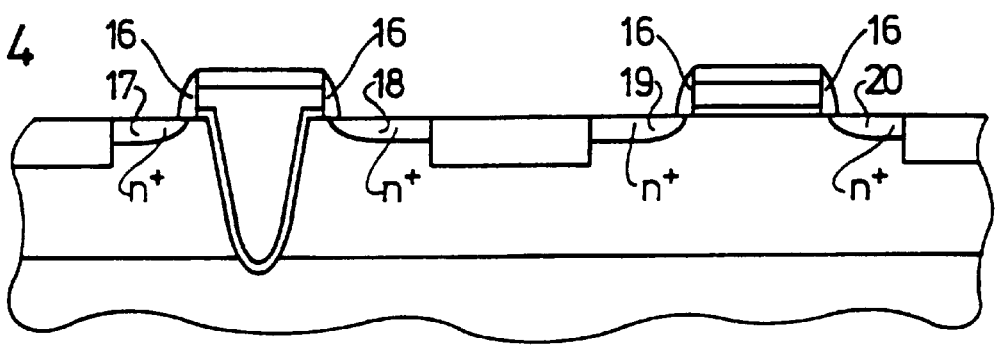
FIG. 4 is a fragmentary, sectional view of the wafer after the steps of reoxidation, LDD (Lightly Doped Drain) implantation and spacer forming, as well as definition of source/drain regions through the use of ion implantation.

FIG. 4 shows that $SiO_2$ spacers 16 are subsequently produced by conformal deposition and anisotropic etching of an $SiO^2$ layer on vertical sides of the word lines 13a and of the gate electrodes 13b, in order to complete the memory transistors T1, T2 and the lateral MOS transistors T3 in the peripheral region 6. Drain regions 17, 18 are formed in the memory cell field 5 and source/drain regions 19, 20 are formed in the peripheral region 6 by implantation with, for example, arsenic at an energy of 50 keV and with a dose of $5 \times 10^{15}$ $cm^{-3}$. Since the regions 17 to 20 of the MOS transistors in the memory cell field 5 and in the peripheral region 6 are doped by the same conductivity type, for example the $n^+$ type and, incidentally, have the same doping as the gate electrode 13b and the word lines 13a, this implantation can take place without an additional mask. Moreover, in order to produce the lateral MOS transistors in the peripheral region 6, it is possible to carry out further method steps which are known per se from MOS technology, such as setting an LDD profile, salicide technique and the like.

Figure 5:
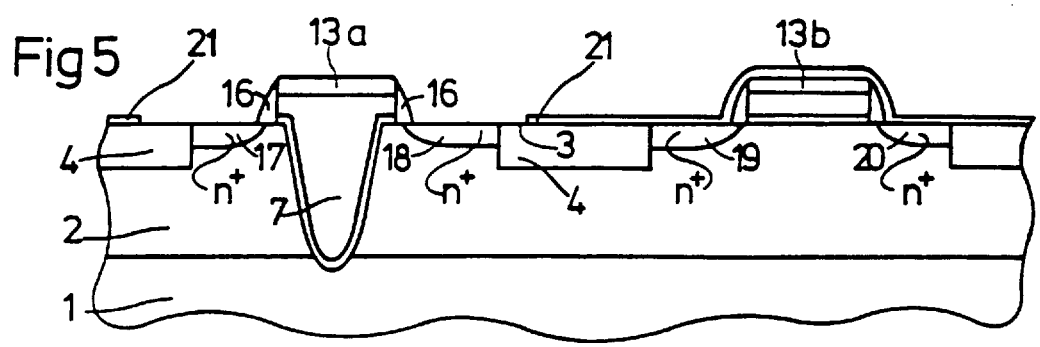
FIG. 5 is a fragmentary, sectional view of the wafer following deposition of an SiO$_2$ or TEOS layer and opening of the source/drain regions with which contact is to be made.
Figure 6:
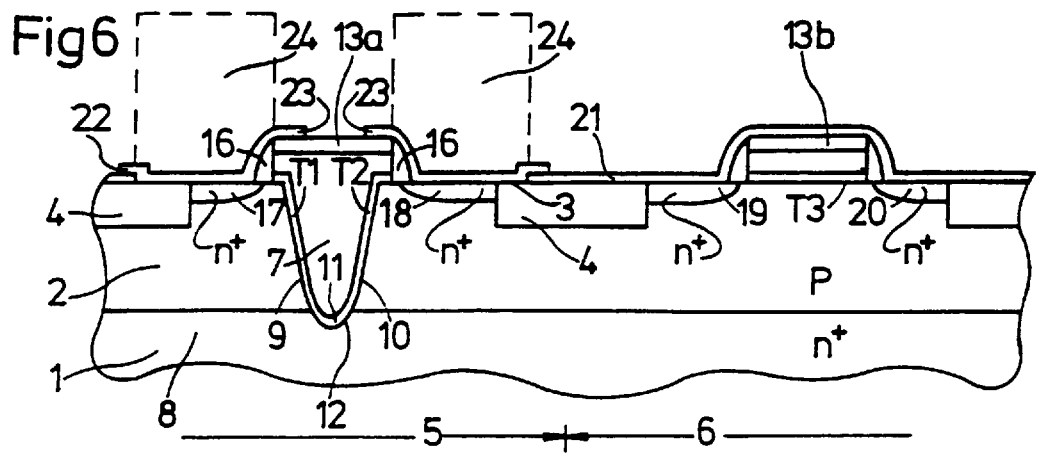
FIG. 6 is a fragmentary, sectional view of the wafer following deposition of a polysilicon layer for local interconnection, doping and structuring.
Figure 7:
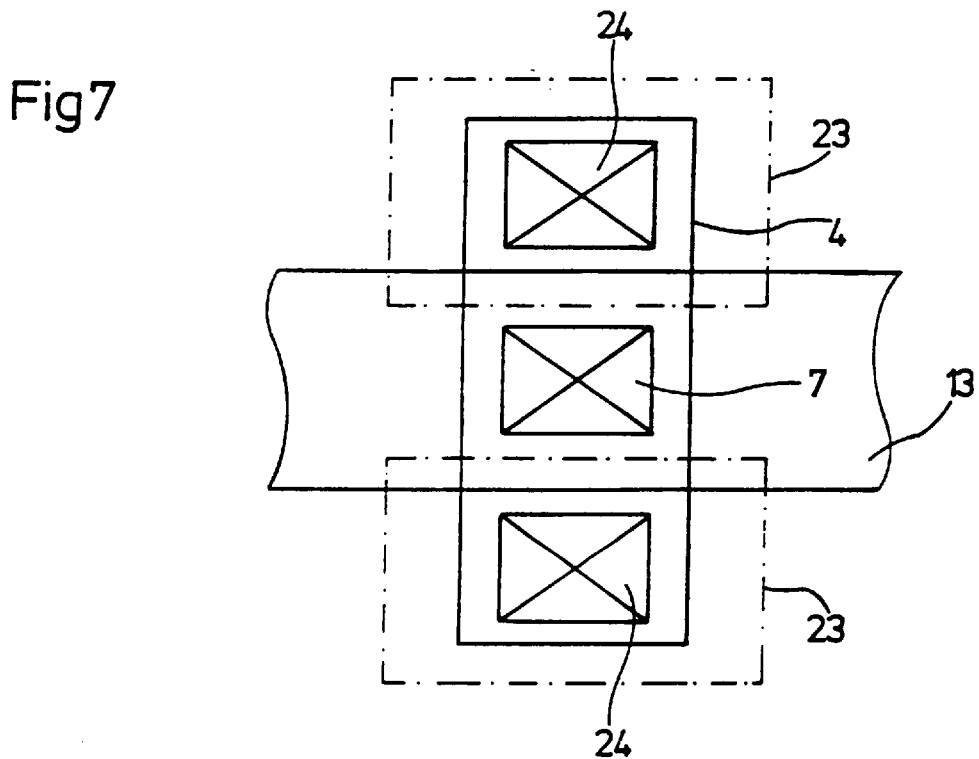
FIG. 7 is a fragmentary, plan view of a cell of the read-only memory according to the first exemplary embodiment of the invention following completion of the local interconnection.

The following is a description with reference to FIGS. 5 and 6 explaining a production of local interconnections for an electrical connection of the drain regions 17, 18 of the trench transistors T1, T2 to contact holes which are disposed in such a way that any overlap of a contact hole (produced later) with regard to the gate and insulation edges can be reduced to zero and the packing density of the memory cells can thus be increased further. According to FIG. 5, an $SiO_2$ layer 21 with essentially conformal edge covering is deposited first by using a TEOS method. The drain regions 17, 18 with which contact is to be made are subsequently opened by using an appropriately structured mask, that is to say the $SiO_2$ layer 21 is removed at these points, for example in an etching process which is selective with respect to silicon, for example by using $CHF_3$, $CF_4$, Ar, until the surface of the second doped region 2 is exposed. As is seen in FIG. 6, an electrically conductive layer 22 is subsequently applied over the whole area and is structured by using a further non-illustrated mask in such a way that a local, that is to say short-range, interconnection 23 remains at those points where the contact holes which are to be produced later and are diagrammatically indicated in FIG. 6 by reference number 24, are formed. The material of the local interconnection 23 preferably is formed of polysilicon, which is either deposited in doped form or is doped after the deposition by implantation or coating. In addition, it is also possible to use other materials such as, for example, polycides or silicides having favorable properties with respect to high-temperature stability. The local interconnection 23 serves as a widening of the drain regions 17, 18, which have only a small connection area. On one hand, this enables a reliable connection of the contact hole 24, which has a specific width depending on the process, to the drain region 17, 18. On the other hand, it enables a larger packing density by avoiding any overlap of the contact hole 24 with regard to the gate insulation edges (see the diagrammatic plan view according to FIG. 7 as well).

A planarizing intermediate oxide layer which is made, for example, of boron-phosphorus-silicate glass is subsequently deposited over the whole area, and the contact holes 24 are opened in that layer, in order to complete the read-only memory cell configuration. The contact holes 24 are subsequently filled, for example, with tungsten. A metallization plane is then produced, for example, by deposition and structuring of an aluminum layer. Finally, a passivation layer is applied. The substrate 1 is also provided with a contact in the process. These standard steps are not depicted in detail.

Seven masks are required in the production process according to the invention, with lateral transistors being produced in the peripheral region 6 at the same time as the cell field 5. The area required by a memory cell is 4 $F^2$ in this exemplary embodiment, where F represents the smallest structure size that can be produced with the respective lithography.

Figure 8A:
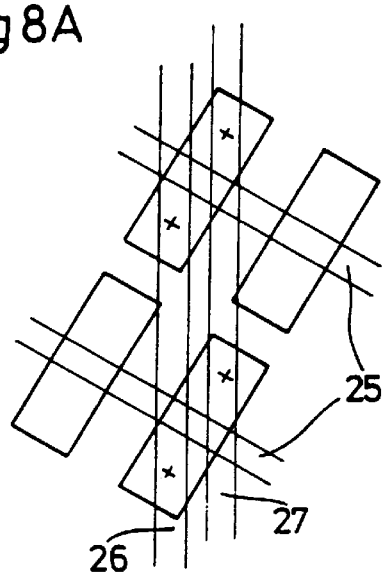
FIGS. 8A and 8B are plan views of the configuration of the memory cells with bit lines running diagonally.
Figure 8B:
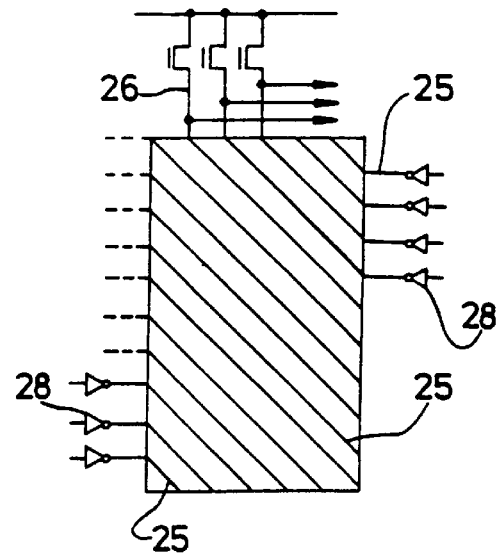

FIGS. 8A, 8B and 9A, 9B illustrate diagrammatic plan views of preferred configurations of the bit lines and word lines over an entire cell field. In FIGS. 8A and 8B, bit lines 25 are guided in a diagonal configuration in the cell field 5, while word lines 26, 27 are guided in a rectilinear configuration. The greatest packing density of the memory cells is given with this configuration of the memory cells and of the word and bit lines. However, a disadvantage of this configuration is that a positioning of bit line drivers 28 is disposed offset at an edge region of the memory cell field 5 due to the diagonal guidance of the bit lines 25, and this results in an increased space requirement at a peripheral region.

Figure 9A:
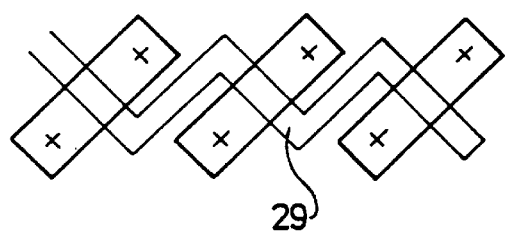
FIGS. 9A and 9B are plan views of the configuration of the memory cells with bit lines running zig-zaggedly.
Figure 9B:
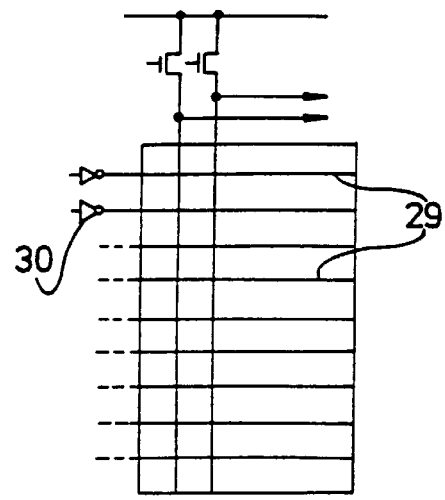

In contrast, FIGS. 9A and 9B show an embodiment of a read-only memory cell configuration in which the individual cells of a field are aligned rectilinearly and bit lines 29 are guided zig-zaggedly, with the result that bit line drivers 30 at the peripheral region of the cell field are disposed next to one another and on one side of the peripheral region. This yields a specific savings in area at the peripheral region, although this is at the expense of the cell area, which is somewhat larger in this embodiment than in the configuration according to FIGS. 8A and 8B.

I claim:

1. A read-only memory cell configuration, comprising:
   a substrate formed of semiconductor material and having a main area;
   a cell field having memory cells in the region of said main area;
   a bit line and a word line;
   each of said memory cells having at least one MOS transistor with a source region, a drain region, a channel region, a gate dielectric and a gate electrode, said drain region connected to said bit line and said gate electrode connected to said word line;
   said at least one MOS transistor being formed by a trench starting at said main area and reaching as far as said source region, said trench defining side walls disposed at an angle of between approximately 45° and approximately 80° relative to said main area and doped with a doping material of a predetermined conductivity for defining a programming of said at least one MOS transistor;
   a gate insulation layer electrically insulating said gate electrode;
   an insulation layer adjacent said at least one MOS transistor; and
   a local interconnection associated with said drain region of said at least one MOS transistor, said local interconnection electrically connecting said drain region, and said local interconnection being disposed at least regionally over said gate insulation layer and said insulation layer.

2. The read-only memory cell configuration according to claim 1, wherein at least two MOS transistors are formed in said trench.

3. The read-only memory cell configuration according to claim 1, wherein two MOS transistors are formed in said trench, and said transistors are programmed differently by different doping of said two side walls of said trench.

4. The read-only memory cell configuration according to claim 3, wherein said two MOS transistors formed in said trench each have a common source region and a common gate region.

5. The read-only memory cell configuration according to claim 1, wherein each MOS transistor of said trench is programmed in a predetermined logic state from a status logic having multi-value logic states.

6. The read-only memory cell configuration according to claim 5, wherein said status logic is a four-value status logic.

7. The read-only memory cell configuration according to claim 1, wherein said gate dielectric has a gate oxide and the read-only memory cell configuration is a mask-programmed read-only memory.

8. The read-only memory cell configuration according to claim 1, wherein said gate dielectric has an ONO forming material and the read-only memory cell configuration is a one-time electrically programmable read-only memory.

9. The read-only memory cell configuration according to claim 1, wherein said local interconnection is produced from a material having a substance selected from the group consisting of polysilicon, polycide and silicide.

10. The read-only memory cell configuration according to claim 1, including a contact hole connection for connecting said drain region to a bit line, said local interconnection connected to said contact hole connection.

11. The read-only memory cell configuration according to claim 10, wherein said contact hole connection is flush with said insulation layer.

* * * * *